US008102152B2

(12) United States Patent
Ugaji et al.

(10) Patent No.: US 8,102,152 B2
(45) Date of Patent: Jan. 24, 2012

(54) DETERIORATION DETECTING METHOD AND DETERIORATION SUPPRESSING METHOD FOR RECHARGEABLE LITHIUM BATTERIES, DETERIORATION DETECTOR, DETERIORATION SUPPRESSOR, BATTERY PACK, AND CHARGER (75) Inventors: Masaya Ugaji, Osaka (JP); Takayuki Shirane, Osaka (JP); Kaoru Inoue, Osaka (JP)

(73) Assignee: Panasonic Corporation, Osaka (JP)

( * ) Notice: Subject to any disclaimer, the term of this patent is extended or adjusted under 35 U.S.C. 154(b) by 415 days.

(21) Appl. No.: 12/161,104

(22) PCT Filed: Jan. 9, 2008

(86) PCT No.: PCT/JP2008/050089
§ 371 (c)(1),
(2), (4) Date: Jul. 16, 2008

(87) PCT Pub. No.: WO2008/084791
PCT Pub. Date: Jul. 17, 2008

(65) Prior Publication Data
US 2010/0156351 A1 Jun. 24, 2010

(30) Foreign Application Priority Data
Jan. 11, 2007 (JP) .................. 2007-003005

(51) Int. Cl.
*H02J 7/00* (2006.01)
*H01M 10/48* (2006.01)
*G01N 27/416* (2006.01)
*H01M 2/24* (2006.01)

(52) U.S. Cl. ........ 320/134; 320/132; 324/426; 324/430; 324/433; 324/434; 429/90; 429/160

(58) Field of Classification Search ................. 320/132, 320/134, 149, DIG. 21; 324/430, 433, 434, 324/426; 429/90, 160
See application file for complete search history.

(56) References Cited

U.S. PATENT DOCUMENTS

| 5,122,751 | A  | * | 6/1992  | Aita et al.      | ...... 324/429 |
| 5,617,002 | A  | * | 4/1997  | Sakamoto         | ...... 320/102 |
| 6,300,013 | B1 |   | 10/2001 | Yamada et al.    |                |
| 6,563,318 | B2 | * | 5/2003  | Kawakami et al.  | ...... 324/426 |

(Continued)

FOREIGN PATENT DOCUMENTS
EP   1 115 171 A1   7/2001
(Continued)

OTHER PUBLICATIONS
www.dictionary.com definition of Ohm's Law.*
(Continued)

*Primary Examiner* — Patrick Assouad
*Assistant Examiner* — Steve T Chung
(74) *Attorney, Agent, or Firm* — McDermott Will & Emery LLP (57) ABSTRACT According to a deterioration detecting method for rechargeable lithium batteries, battery voltages of a rechargeable lithium battery before and after the completion of charging or discharging are measured. An evaluation value is calculated based on the measured battery voltages. This evaluation value is compared with a reference value of the rechargeable lithium battery stored in advance. A deterioration level of the rechargeable lithium battery is estimated based on this comparison result. In addition, further deterioration can be suppressed by controlling charging and discharging of the rechargeable lithium battery based on the estimated deterioration level.

24 Claims, 4 Drawing Sheets

U.S. PATENT DOCUMENTS

| | | | |
|---|---|---|---|
| 6,664,764 B1* | 12/2003 | Odaohhara | 320/132 |
| 6,911,804 B2* | 6/2005 | Mori | 320/132 |
| 7,071,653 B2* | 7/2006 | Suzuki et al. | 320/128 |
| 2001/0028238 A1 | 10/2001 | Nakamura et al. | |
| 2003/0062875 A1 | 4/2003 | Nakamura et al. | |
| 2004/0174141 A1* | 9/2004 | Luz et al. | 320/132 |
| 2005/0035743 A1 | 2/2005 | Kawakami et al. | |
| 2007/0029972 A1* | 2/2007 | Lampe-Onnerud et al. | 320/132 |
| 2007/0120554 A1 | 5/2007 | Kawakami et al. | |
| 2010/0156356 A1* | 6/2010 | Asakura et al. | 320/148 |
| 2011/0193516 A1* | 8/2011 | Oohara et al. | 320/101 |

FOREIGN PATENT DOCUMENTS

| | | |
|---|---|---|
| EP | 1 167 988 A1 | 1/2002 |
| EP | 1 577 677 A1 | 9/2005 |
| JP | 11-233155 | 8/1999 |
| JP | 2000-67932 | 3/2000 |
| JP | 2000-092732 | 3/2000 |
| JP | 2000-299137 | 10/2000 |
| JP | 2000-323174 | 11/2000 |
| JP | 2000-357514 | 12/2000 |
| JP | 2003-009407 A | 1/2003 |
| JP | 2003-157912 | 5/2003 |
| JP | 2004-152755 | 5/2004 |
| JP | 2005-010032 | 1/2005 |

OTHER PUBLICATIONS

European Search Report issued in European Patent Application No. 08710538.3-1227, mailed Feb. 16, 2011.

* cited by examiner

DETERIORATION DETECTING METHOD AND DETERIORATION SUPPRESSING METHOD FOR RECHARGEABLE LITHIUM BATTERIES, DETERIORATION DETECTOR, DETERIORATION SUPPRESSOR, BATTERY PACK, AND CHARGER

RELATED APPLICATIONS

This application is the U.S. National Phase under 35 U.S.C. §371 of International Application No. PCT/JP2008/050089, filed on Jan. 9, 2008, which in turn claims the benefit of Japanese Application No. 2007-003005, filed on Jan. 11, 2007, the disclosures of which Applications are incorporated by reference herein.

TECHNICAL FIELD

The present invention relates to methods of detecting deterioration of rechargeable lithium batteries, and charge and discharge control for suppressing deterioration.

BACKGROUND ART

A demand for batteries as a power source is increasing in line with development of portable devices such as personal computers and mobile phones.

Batteries for these devices are expected to be used at normal temperatures. In addition, high energy density and good cycle characteristics are demanded.

To meet this demand, a new active material with high-capacity density has been developed for a positive electrode and negative electrode, respectively. In particular, there is a great interest in using elemental silicon (Si) or tin (Sn), its alloy, or its oxide as a negative active material.

However, rechargeable lithium batteries using these negative active materials do not demonstrate a sufficient charge/discharge cycle characteristics. More specifically, silicon oxide $SiO_x$ (x=0.3) is used as a negative active material. Lithium cobalt oxide ($LiCoO_2$) is used as a positive active material, which is generally used for rechargeable lithium batteries. As electrolyte, a mixed solution of ethylene carbonate (EC) and ethylmethylcarbonate (EMC) containing lithium hexafluorophosphate ($LiPF_6$) is used. These materials are used for manufacturing a rechargeable lithium battery with winding the electrodes. This battery shows a significant deterioration in its capacity when charging and discharging is repeated for about 100 cycles under next conditions: 1.0 C of charge/discharge current, 4.2 V of charge cutoff voltage, and 2.5 V of discharge cutoff voltage.

To prevent this deterioration, a discharge potential of the negative electrode is preferably kept as low as possible. For example, Patent Document 1 discloses suppression of deterioration in capacity due to charge/discharge cycles by controlling the discharge cutoff potential of the negative electrode to 0.6 V or lower relative to a reference electrode of lithium in a rechargeable lithium battery using silicon oxide (SiO) as the negative active material.

However, if the reference electrode of lithium is provided in the battery in order to control discharge potential of the negative electrode made of SiO relative to the reference electrode, as in Patent Document 1, a battery structure becomes complicated, causing a disadvantage in practical use. In other words, a third electrode terminal, in addition to positive and negative electrode terminals, becomes necessary in the battery. Still more, if the charge/discharge cycle is repeated from an initial period when there is no deterioration in positive and negative active materials, potential ranges in which positive and negative electrodes are used, respectively, will change as positive and negative active materials are deteriorated. Therefore, even if the discharge cutoff potential of the negative electrode is set to 0.6 V or lower relative to the positive electrode, it is difficult to confirm whether the discharge cutoff potential of the negative electrode is actually maintained at 0.6 V or lower. Accordingly, it is difficult to suppress deterioration in capacity due to repeated charge/discharge cycles by detecting the charge/discharge state of the negative electrode based on measurement of the battery voltage.

Patent Document 1: Japanese Patent Unexamined Publication No. H11-233155

SUMMARY OF THE INVENTION

The present invention offers a method of detecting deterioration of rechargeable lithium batteries due to repeated charge/discharge cycles, and a method of suppressing deterioration based on a detection result. The present invention also offers a deterioration detector, a deterioration suppressor, a charger, and a battery pack to which these methods are applied.

A deterioration detecting method of the present invention is applicable to rechargeable lithium batteries including a positive electrode having a positive active material that absorbs and emits lithium ions, a negative electrode having a negative active material that contains at least one of elements of silicon and tin, and lithium-ion conductive electrolyte provided between the positive electrode and the negative electrode. The method includes the following four steps.

In the first step, a group of closed-circuit charge cutoff voltage and open-circuit voltage after charging and/or a group of a closed-circuit discharge cutoff voltage and open-circuit voltage after discharging of the rechargeable lithium battery is detected.

In the second step, an evaluation value is calculated based on the detected group(s) of the voltages.

In the third step, this evaluation value is compared with a reference value stored in advance.

In the fourth step, a deterioration level of the rechargeable lithium battery is estimated based on a comparison result in the third step.

In this way, the deterioration level of the rechargeable lithium battery can be accurately estimated by measuring the battery voltage before and after the completion of charging, or before and after the completion of discharging.

A deterioration suppressing method of the present invention controls charging or discharging of the rechargeable lithium battery based on the deterioration level estimated by the above deterioration detecting method.

According to the present invention, it is possible to estimate an accurate deterioration level even if a capacity of rechargeable lithium battery degrades in line with progression of charge/discharge cycles. In addition, deterioration in capacity can be suppressed by controlling charging and discharging based on the deterioration level. Accordingly, the rechargeable lithium battery can be used for numerous times by repeating charge and discharge while retaining large capacity.

DETAILED DESCRIPTION OF PREFERRED EMBODIMENTS

Preferred embodiments of the present invention are described below with reference to drawings. However, the present invention is not limited to the following description.

Figure 1:
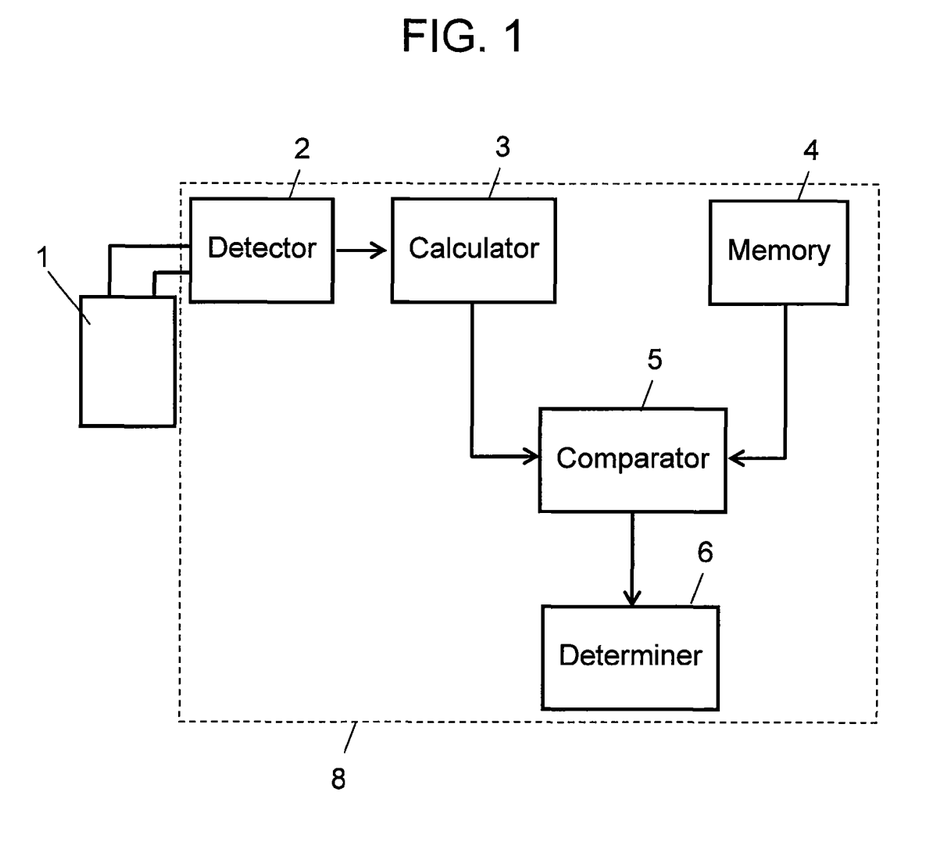
FIG. 1 is a block diagram of a deterioration detector of a rechargeable lithium battery in accordance with a preferred embodiment of the present invention.

FIG. 1 is a block diagram of a deterioration detector of rechargeable lithium battery 1 in accordance with a preferred embodiment of the present invention. Deterioration detector 8 includes detector 2, calculator 3, memory 4, comparator 5, and determiner 6. Detector 2 detects battery voltage of rechargeable lithium battery 1. Calculator 3 calculates an evaluation value based on the detected battery voltage. Memory 4 stores a reference value of rechargeable lithium battery 1. Comparator 5 compares the stored reference value and the evaluation value. Determiner 6 estimates a deterioration level of rechargeable lithium battery 1 based on a difference calculated by comparator 5.

Figure 2:
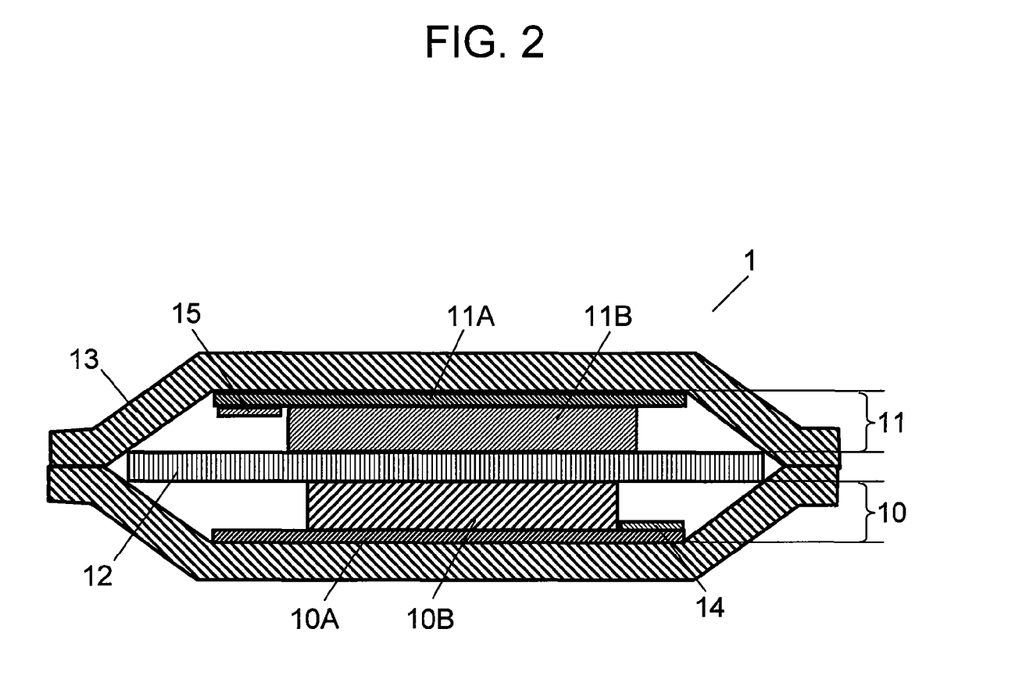
FIG. 2 is a schematic sectional view a laminated battery that is an example of the rechargeable lithium battery whose deterioration is estimated by the deterioration detector in accordance with the preferred embodiment of the present invention.

FIG. 2 is a sectional view of a structure of a laminated battery, which is an example of the rechargeable lithium battery 1 whose deterioration is estimated by deterioration detector 8 shown in FIG. 1. An electrode group includes positive electrode 10, negative electrode 11, and separator 12 between these electrodes. The electrode group and lithium-ion conductive nonaqueous electrolyte (not illustrated) are housed in outer casing 13. Separator 12 is impregnated with the nonaqueous electrolyte.

Positive electrode 10 includes positive-electrode collector 10A and positive active material layer 10B supported by positive-electrode collector 10A. Negative electrode 11 includes negative-electrode collector 11A and negative active material layer 11B supported by negative-electrode collector 11A. Positive active material layer 10B generally includes a positive active material, conductivity aid, and binder, but it can also include only the positive active material. Negative active material layer 11B also generally includes a negative active material, conductivity aid, and binder, but it can also include only the negative active material.

Positive-electrode collector 10A and negative-electrode collector 11A are connected to one end of positive-electrode lead 14 and one end of negative-electrode lead 15, respectively. The other ends of positive-electrode lead 14 and negative-electrode lead 15 are led outside of outer casing 13, respectively.

Positive active material layer 10B includes the positive active material that can absorb and emit lithium ions. This material is typically lithium cobalt oxide ($LiCoO_2$), lithium nickel oxide ($LiNiO_2$), or lithium manganese oxide ($LiMn_2O_4$). However, the present invention is not limited to these materials. For positive-electrode collector 10A, Al, Al alloy, Ni, Ti, and so on can be used.

Diversifying solid electrolytes and nonaqueous electrolyte solutions having lithium-ion conductivity can be used as the nonaqueous electrolyte. As the nonaqueous electrolyte solution, it is preferable to use a solution including a nonaqueous solvent and a salt of lithium dissolved therein. Publicly-known compositions are applicable to the nonaqueous electrolyte solution, and thus their compositions are not particularly limited.

Separator 12 and outer casing 13 are made of any general material used for rechargeable lithium batteries in diversifying forms, without any limitation.

If silicon (Si) or tin (Sn) is used for negative active material layer 11B, the negative active material needs to be set to a non-fully charged state when the battery is fully charged or fully discharged. More specifically, for example, the negative active material is set to a charged state of 90% or less when the battery is fully charged, and set to the charged state of 10% or more when the battery is fully discharged.

If the charged state of negative active material layer 11B is over 90% when the battery is fully charged, lithium ions cannot be further received. This increases reaction resistance. In other words, if negative active material layer 11B is charged to the level over 90%, a lithium concentration in the negative active material increases and strengthens an interaction between lithium ions. This delays diffusion of lithium in the negative active material. In particular, a diffusion-limited state occurs on the surface of the negative active material. Accordingly, lithium ions from the nonaqueous electrolyte not received inside the negative active material will separate out on the surface of negative active material layer 11B as metal lithium, or received only at portions receivable even if lithium ions are received. Therefore, portions receiving lithium ions and portions not receiving lithium ions exist in a dotted manner. This makes the composition of negative active material nonuniform. If the charge/discharge cycle is repeated while producing this nonuniform composition, the cycle life rapidly deteriorates.

On the other hand, if negative active material layer 11B is in a charged state to the level less than 10% when the battery is fully discharged, it becomes difficult to further emit lithium ions from negative active material layer 11B, resulting in increasing reaction resistance. This is because some lithium in negative active material layer 11B forms a backbone structure of Si or Sn alloyed with lithium, and the backbone structure of negative active material layer 11B will be destroyed if lithium forming the backbone structure is emitted at the time of discharge. Accordingly, if discharge that leads to destruction of the backbone structure is repeated, the cycle life rapidly deteriorates.

As described above, if the battery is repeatedly charged and discharged while negative active material layer 11B is in the charge state (depth of charge) out of the above range, the reaction resistance increases.

To charge and discharge negative electrode 11 in the above range, a charger is generally set to charge and discharge the battery voltage within a predetermined voltage range. However, corresponding to respective cycle deterioration of positive and negative active materials, the operable potential ranges of positive electrode 10 and negative electrode 11 changes, respectively. Therefore, it is difficult to suppress deterioration of capacity due to charge/discharge cycles just by controlling a potential difference between positive electrode 10 and negative electrode 11, which is the battery voltage.

In the preferred embodiment, detector 2 detects the battery voltage of rechargeable lithium battery 1 for multiple times in order to retain the charged state of the negative active material containing elements of at least Si or Sn at the level of 90% or lower when the battery is fully charged, and at the level of 10% or higher when the battery is fully discharged. The battery voltage detected by detector 2 is preferably the closed-circuit battery voltage, which is the loaded state of battery where current is applied, and open-circuit battery voltage, which is the non-loaded state where no current is applied. In other words, the battery voltage detected by detector 2 is preferably at least measured at one or more points of time during closed circuit and open circuit, respectively. Calculator 3 then calculates an evaluation value using the detected multiple battery voltages.

In particular, the closed-circuit battery voltage is preferably charge cutoff voltage and discharge cutoff voltage. The charge cutoff voltage is the closed-circuit battery voltage at the completion of charging. For example, this is the battery voltage at full charge. The discharge cutoff voltage is the closed-circuit battery voltage at the completion of discharging. For example, this is the battery voltage at full discharge.

The charge cutoff voltage and discharge cutoff voltage in the state that the rechargeable lithium battery is in the partially charged state, due to forcible completion of charge and discharge, are also applicable. However, possibility of accelerated deterioration is higher at full charge or full discharge. Accordingly, it is not necessary to detect the battery voltage if a partial charge level of the battery is less than 90% or greater than 10% of full charge. If environmental temperature significantly changes, the battery voltage detected is preferably compensated, taking into account actual temperature of the rechargeable lithium battery.

The open-circuit battery voltage used in calculator 3 is preferably, in particular, the open-circuit battery voltage after full charge and the open-circuit battery voltage after full discharge. The evaluation value is calculated using the closed-circuit battery voltage and the open-circuit battery voltage. Each value is preferably measured in a process that the battery voltage changes in line with switchover from closed circuit where current is applied during charge and discharge, to open circuit where current is not applied.

As described above, the preferred embodiment is applicable to rechargeable lithium battery 1 that includes positive electrode 10 having positive active material absorbing and emitting lithium ions, negative electrode 11 having negative active material containing elements of at least Si or Sn, and lithium-ion conductive electrolyte provided between positive electrode 10 and negative electrode 11. The group of closed-circuit charge cutoff voltage and the open-circuit voltage after charging or the group of closed-circuit discharge cutoff voltage and open-circuit voltage after discharging is detected. The evaluation value is calculated based on the detected group of the voltages. Then, this evaluation value and the reference value stored in advance are compared. Based on a comparison result, a deterioration level of rechargeable lithium battery 1 is estimated. Accordingly, the deterioration level of rechargeable lithium battery 1 can be accurately estimated by measuring the battery voltages before and after the completion of charging or before and after the completion of discharging.

As the evaluation value, difference ($\Delta V_1$) between the closed-circuit charging cutoff voltage and the open-circuit battery voltage after charge can be used. Here, the open-circuit battery voltage after predetermined time ($\Delta t_1$) has elapsed from charging is used as the open-circuit battery voltage after charging. In the last phase of charging, reaction resistance of negative electrode 11 increases, and thus $\Delta V_1$ becomes greater. In particular, $\Delta V_1$ becomes greater if deterioration advances. Accordingly, the deterioration level of rechargeable lithium battery 1 can be accurately estimated. The predetermined time is not limited, but preferably from 1 second to 1 hour.

Alternatively, difference ($\Delta V_2$) between the closed-circuit discharge cutoff voltage and the open-circuit battery voltage after discharging can also be used as the evaluation value. In the same way as that in charging, the open-circuit battery voltage after predetermined time ($\Delta t_2$) has elapsed from discharging is used as the open-circuit battery voltage after discharging. Also in the last phase of discharging, reaction resistance of negative electrode 11 increases, and thus $\Delta V_2$ becomes greater. In particular, $\Delta V_2$ becomes greater if deterioration advances. Accordingly, the deterioration level of rechargeable lithium battery 1 can be accurately estimated. The predetermined time is not limited, but preferably from 1 second to 1 hour.

In particular, if a charge/discharge current changes frequently in the charge/discharge cycle or during charging and discharging, the open-circuit battery voltage also significantly changes depending on current values. In this case, apparent resistance $R_1$ ($\Delta V_1/I_1$), which is divided result of $\Delta V_1$ by closed-circuit charge cutoff current ($I_1$), or apparent resistance $R_2$ ($\Delta V_2/I_2$), which is divided result of $\Delta V_2$ divided by closed-circuit discharge cutoff current ($I_2$) is preferably used as the evaluation value. The deterioration level of a rechargeable lithium battery can thus be accurately estimated also by using apparent internal resistance $R_1$ in the last phase of charging or apparent internal resistance $R_2$ in the last phase of discharging.

The reference value used for estimating the deterioration level by comparing with the evaluation value is stored in advance in memory 4, which is typically a magnetic storage medium or nonvolatile memory. The reference value is a value comparable with the evaluation value. The reference value is a theoretical value that is a value, for example, set in advance with respect to the rechargeable lithium battery before deterioration starts. In general, battery characteristics of each battery slightly differ even for the same type of batteries. Accordingly, the reference value is preferably set for each battery. If multiple battery cells are connected in series or in parallel, a reference value for a battery pack configured with multiple connected cells may be set, instead of the reference value for each cell. As the reference value, the evaluation value in a charge/discharge cycle before detector 2 detects the battery voltage can also be used.

Comparator 5 calculates the difference between the detected evaluation value of rechargeable lithium battery 1 and the reference value. It is acceptable to have two or more evaluation values for comparison by comparator 5.

Determiner 6 estimates the deterioration level of rechargeable lithium battery 1 based on the result of comparator 5.

Figure 3:
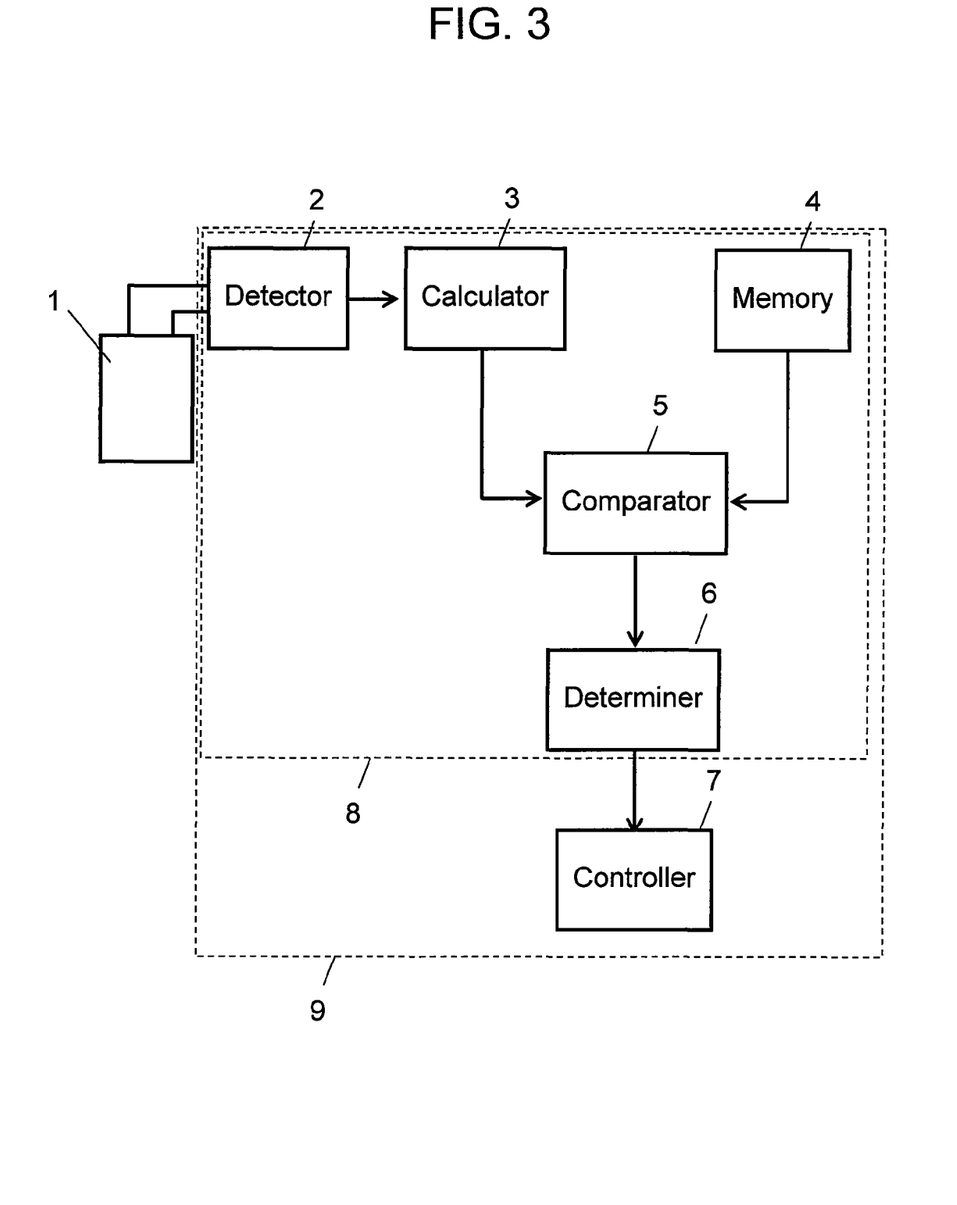
FIG. 3 is a block diagram of a deterioration suppressor of the rechargeable lithium battery in accordance with the preferred embodiment of the present invention.

Next is described a method of suppressing further deterioration by controlling charge, discharge, or both based on the deterioration level of rechargeable lithium battery estimated by using the deterioration detecting method for rechargeable lithium batteries in the preferred embodiment, with reference to FIG. 3. FIG. 3 is a block diagram of a deterioration suppressor for rechargeable lithium battery in the preferred embodiment of the present invention. Deterioration suppressor 9 is configured with aforementioned deterioration detector 8 and controller 7.

Controller 7 changes a charge capacity, a discharge capacity, or both based on the deterioration level calculated by determiner 6. In other words, controller 7 forcibly decreases the charge capacity, discharge capacity, or both, depending on the deterioration level, so as to suppress further deterioration. Accordingly, in the preferred embodiment, charge, discharge, or both charge and discharge of rechargeable lithium battery 1 can be controlled based on the estimated deterioration level. The deterioration level is fed back to charge/discharge control so that deterioration of rechargeable lithium battery 1 can be suppressed. There are the next methods of control: One is to make charge time, discharge time, or both charge and discharge time shorter than before, and the other is to change the charge/discharge voltage of the battery so as to reduce the charge cutoff voltage or increase the discharge cutoff voltage. In case of constant voltage charge, deterioration of rechargeable lithium battery 1 can be suppressed by making the charge time shorter than before so as to reduce the charge depth. In case of constant current charge, deterioration of rechargeable lithium battery 1 can be suppressed by reducing the charge cutoff voltage so as to reduce the charge depth. In addition, deterioration of rechargeable lithium battery 1 can be suppressed by reducing the discharge depth at the completion of discharge so as to increase residual capacity even when the discharge time is shortened or the discharge cutoff voltage is increased.

This way of control can keep the charge depth of negative active material layer 11B within a set range at full charge, full discharge, or both of rechargeable lithium battery 1. Deterioration suppressor 9 in this preferred embodiment is applicable to a charger for controlling charging, and to a discharge controller for controlling discharging.

Figure 4:
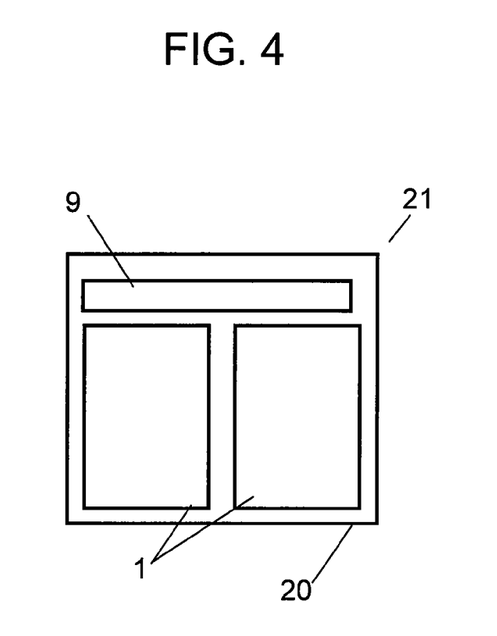
FIG. 4 illustrates a structure of a battery pack in which the deterioration suppressor of the rechargeable lithium battery in accordance with the preferred embodiment of the present invention is installed.

Aforementioned deterioration detector 8 and deterioration suppressor 9 having controller 7 for controlling charge or discharge can also be installed in casing 20 of battery pack 21 of rechargeable lithium battery 1, as shown in FIG. 4. FIG. 4 illustrates a structure of a battery pack in which the deterioration suppressor of the rechargeable lithium battery in this preferred embodiment is installed. Details including wiring are omitted in the drawing.

More specifically, battery pack 21 includes deterioration suppressor 9 and rechargeable lithium battery 1 whose deterioration is suppressed. In battery pack 21, one or more rechargeable lithium batteries 1 are installed. In addition, either prismatic or cylindrical batteries are applicable. Deterioration suppressor 9 may also be configured as an IC chip. In this case, deterioration suppressor 9 may be integrated with a battery control IC circuit for controlling charge and discharge of current, voltage, temperature, and so on.

Figure 5:
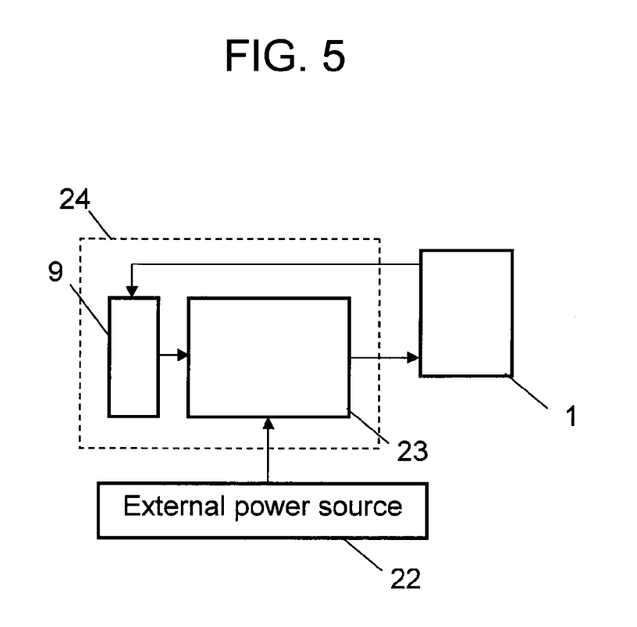
FIG. 5 is a block diagram of a charger employing the deterioration suppressor of the rechargeable lithium battery in accordance with the preferred embodiment of the present invention.

As shown in FIG. 5, deterioration suppressor 9 may also be installed in charger 24 for charging rechargeable lithium battery 1. FIG. 5 is a block diagram of the charger employing the deterioration suppressor of a rechargeable lithium battery in the preferred embodiment of the present invention.

More specifically, charger 24 includes deterioration suppressor 9 for rechargeable lithium battery 1 having controller 7 for controlling charging, and charging part 23 for charging rechargeable lithium battery 1. Charging part 23 rectifies voltage from external power source 22, such as AC power supply; converts voltage; and controls current. Deterioration suppressor 9 controls and adjusts voltage and current. Deterioration suppressor 9 may be configured as an IC chip even for this type of charger 24. In this case, deterioration suppressor 9 may be integrated with a charge control IC circuit for controlling current, voltage, and temperature.

The present invention demonstrates its effect when negative electrode 11 of rechargeable lithium battery 1 has the negative active material containing at least one type of element of Si or Sn.

More specifically, this includes elemental Si or Sn, alloy containing Si or Sn, compound containing Si or Sn and oxygen, and compound containing Si or Sn and nitrogen. These substances may configure negative active material layer 11B alone, or by combination of two or more. A compound containing Si or Sn and nitrogen may further contain oxygen. Examples of configuring negative active material layer 11B with combination of two or more are compounds of $SiO_xN_y$ and $SnO_xN_y$ containing Si or Sn, oxygen, and nitrogen. Or, the negative active material may be made of multiple oxides of $SiO_x$ or $SnO_x$ with different ratio of oxygen vs. Si or Sn. The negative active material containing Si or Sn may be either crystalline or noncrystalline.

In case of alloy, metal element M contained in alloy, other than Si or Sn, is preferably a metal element that does not form alloy with lithium. Metal element M may be any chemically-stable electronic conductor, but is preferably selected from at least one from a group consisting of titanium (Ti), copper (Cu), and nickel (Ni). Metal element M may also be a single element contained in alloy independently, or two or more of elements. There is also no limit to the molar ratio between Si or Sn and metal element M in alloy. However, the following range is preferable.

If metal element M is Ti, $0<Ti/Si<2$ is preferable, and in particular, $0.1 \leq Ti/S \leq 1.0$ is more preferable.

If metal element M is Cu, $0<Cu/Si<4$ is preferable, and in particular, $0.1 \leq Cu/Si \leq 2.0$ is more preferable.

If metal element M is Ni, $0<Ni/Si<2$ is preferable, and in particular, $0.1 \leq Ni/Si \leq 1.0$ is preferable.

If metal element M is Ti, $0<Ti/Sn<2$ is preferable, and in particular, $0.1 \leq Ti/Sn \leq 1.0$ is more preferable.

If metal element M is Cu, $0<Cu/Sn<4$ is preferable, and in particular, $0.1 \leq Cu/Sn \leq 2.0$ is more preferable.

If metal element M is Ni, $0<Ni/Sn<2$ is preferable, and in particular, $0.1 \leq Ni/Sn \leq 1.0$ is more preferable.

There is no particular limit to compounds containing Si and oxygen. However, it is preferable to have a composition expressed by general formula (1): $SiO_x$ (provided that $0<x<2$). Here, value x indicating content of oxygen element is further preferably $0.01 \leq x \leq 1$.

There is also no particular limit to compounds containing Si and nitrogen. However, it is preferable to have a composition expressed by general formula (2): $SiN_y$ (provided that $0<y<4/3$). Here, value y indicating content of nitrogen element is further preferably $0.01 \leq y \leq 1$.

There is also no particular limit to compounds containing Sn and oxygen. However, it is preferable to have a composition expressed by general formula (1): $SnO_x$ (provided that $0<x<2$). Here, value x indicating content of oxygen element is further preferably $0.01 \leq x \leq 1$.

There is also no particular limit to compounds containing Sn and nitrogen. However, it is preferable to have a composition expressed by general formula (2): $SnN_y$ (provided that $0<y<4/3$). Here, value y indicating content of nitrogen element is further preferably $0.01 \leq y \leq 1$.

There is no significant difference in charge/discharge reaction for receiving and emitting lithium ions even if the negative active material containing Si or Sn is alloy containing Si or Sn, a compound containing Si or Sn and oxygen, or a compound containing Si or Sn and nitrogen, in addition to elemental Si or Sn. This is because the charge/discharge reaction is basically alloy reaction between Si or Sn and lithium, and thus metal element M in alloy of Si or Sn, and oxygen or nitrogen in the compound are not practically involved in the charge/discharge reaction.

Accordingly, alloy containing Si or Sn, a compound containing Si or Sn and oxygen, or a compound containing Si or Sn and nitrogen also causes deterioration in the charge/discharge cycle due to the same mechanism as that for elemental Si or Sn. It is thus necessary to set the negative active material to a non-fully charged state when the battery is fully charged or fully discharged, same as the case of elemental Si or Sn. In other words, the negative-electrode active material needs to be set to non-fully charged state of 90% or less when the battery is fully charged, and to the non-fully charged state of 10% or more when the battery is fully discharged.

Exemplary Example

Next, the present invention is described in details based on exemplary examples. However, the present invention is not limited to the following examples.

In the example, the deterioration detecting method and the deterioration suppressing method of the present invention for rechargeable lithium batteries are applied to a rechargeable lithium battery using lithium cobalt oxide ($LiCoO_2$) as the positive active material, and silicon oxide $SiO_x$ ($x=0.3$) as the negative active material. For both exemplary and comparative pieces, negative electrode 11 and rechargeable lithium battery 1 are manufactured according to the following procedures so as to evaluate their cycle life and discharge capacity.

(1) Manufacturing of the Negative Electrode

Negative electrode 11 is manufactured using a deposition device equipped with an electron beam (EB) heater (not illustrated). The deposition device includes a gas pipe (not illustrated) for leading oxygen gas to a chamber, and a nozzle. The nozzle is connected to a pipe inserted to a vacuum chamber. The pipe is connected to an oxygen tank via a mass-flow controller. The nozzle emits oxygen gas, whose purity is 99.7%, at a flow rate of 80 sccm so as to create an oxygen ambient inside the vacuum chamber. A fixing table for securing negative-electrode collector 11A is installed over the nozzle. This collector 11A is made of a 20-μm thick electrolytic copper foil. A target, which is an evaporation source, is disposed vertically downward of the fixing table. Target is made of silicon whose purity is 99.9999%.

An electron beam of accelerating voltage of −8 kV and emission current of 500 mA is irradiated to the target so as to evaporate silicon. Vapor of silicon passes through the oxygen ambient, and then a compound containing silicon and oxygen is deposited over negative-electrode collector 11A made of a copper foil on the fixing table for 20 minutes. This forms negative active material layer 11B, and completes manufacturing of negative electrode 11.

Quantity of oxygen in negative active material layer 11B is determined using a combustion method so as to identify composition of a compound containing silicon and oxygen. The result reveals that the composition is $SiO_{0.3}$. In X-ray diffraction analysis, a crystalline peak attributed to Cu of negative-electrode collector 11A and other peaks including broad peak at positions of $15°<2\theta\leq40°$ are detected. The result of x-ray diffraction analysis reveals that the compound containing deposited silicon and oxygen is noncrystalline. Negative-electrode active material layer 11B manufactured as above is about 9.5 μm thick.

This negative electrode is again placed in the above vacuum deposition device, and oxygen-gas emission is stopped. Lithium is evaporated from a metal Li target (made by Honjo Chemical Co., Ltd.) by resistance heating in vacuum so as to deposit lithium on both faces of the negative electrode. An amount of deposition is changed by changing a transfer speed of the negative electrode so as to deposit a predetermined amount of lithium on the surfaces of negative electrode. By changing this deposition amount of lithium, irreversible capacity of the negative electrode is compensated. This enables the control of the non-fully charged state of the negative active material when the battery is fully charged or fully discharged.

After forming a thin film of $SiO_{0.3}$, negative electrode 11 is vacuum-dried at 100° C. for 10 hours, and then stored at a room temperature in a dry ambient with a dew point of −60° C. or lower. Then, as described previously, a predetermined amount of lithium is added by deposition. After depositing lithium, negative electrode 11 is also stored in the dry ambient with a dew point of −60° C. or lower.

(2) Manufacturing of the Positive Electrode $Li_2CO_3$ and $CoCO_3$ are mixed at a predetermined molars ratio, and heated at 950° C. to synthesize $LiCoO_2$. This is classified to the size of 45 μm or smaller for use as the positive active material. A positive electrode mixture paste is prepared by thoroughly mixing 5 parts by weight of acetylene black as conductive agent, 4 parts by weight of polyvinylidene-fluoride as a binder, and an appropriate amount of n-methyl-2-pyrolidone as a dispersing medium with respect to the positive active material of 100 parts by weight.

This positive electrode mixture paste is applied to positive-electrode collector 10A made of a 15-μm thick aluminum foil, dried, and roll-pressed so as to complete positive electrode 10 including positive-electrode collector 10A and positive active material layers 10B supported on it.

Positive electrode 10 is stored at a room temperature in a dry ambient with a dew point of −60° C. or lower. For use, positive electrode 10 is vacuum dried at 80° C. immediately before assembling a battery.

(3) Manufacturing of the Rechargeable Lithium Battery

Rechargeable lithium battery 1 having a structure shown in FIG. 2 is manufactured according to the following procedures. First, positive electrode 10 and negative electrode 11 prepared through aforementioned (1) and (2) are cut to predetermined sizes, respectively. Positive-electrode lead 14 made of aluminum is connected to positive-electrode collector 10A at one end thereof. Negative-electrode lead 15 made of nickel is connected to negative-electrode collector 11A at one end thereof. Then, positive electrode 10 and negative electrode 11 are laminated via separator 12 made of a fine porous film of 20-μm thick polyethylene resin to configure an electrode group. Separator 12 is wider than the both electrodes. The electrode group is vacuum-dried at 60° C. for 10 hours in a dry oven installed in a dry ambient with a dew point of −60° C. so that moisture in the electrode group is reduced. Before assembling the electrode group, separator 12 and other battery materials are fully dried to reduce moisture carried into rechargeable lithium battery 1. After covering the outer face of the electrode group with separator 12, the electrode group is housed in a bag-like outer casing 13. Then, nonaqueous electrolyte is filled into outer casing 13 so that the electrode group is impregnated with the nonaqueous electrolyte. An opening of outer casing 13 is heat-sealed in a state that the other ends of positive-electrode lead 14 and negative-electrode lead 15 protrude from outer casing 13.

As the nonaqueous electrolyte, a solution in which 1 mol/L concentration of lithium hexafluorophosphate is dissolved in nonaqueous solvent of ethylene carbonate and diethyl carbonate mixed in a volume ratio of 1:1 is used. Qualitative and quantitative analysis of the acid level and acid content of this nonaqueous electrolyte reveal that its main constituent is hydrofluoric acid, and its total amount is 18 ppm.

(4) Evaluation of Charge/Discharge Cycle Test

In a temperature-controlled chamber set to 20° C., a charge/discharge cycle is repeated under the next conditions on rechargeable lithium battery 1 thus manufactured.

Rechargeable lithium battery 1 is charged with 1 C of constant current until the battery voltage becomes 4.20 V, and then charged with constant voltage of 4.20V until the current is reduced to 0.05 C. Then, the battery is discharged at 1 C of constant current until the battery voltage becomes 2.5V. This charge and discharge operation is repeated, and discharge capacity in each cycle is evaluated setting a theoretical discharge capacity as 100.

The deterioration detecting method in the preferred embodiment is applied to evaluation of the charge/discharge cycle test described in above (4), using deterioration detector 8 shown in FIG. 1. According to aforementioned (1), (2), and (3), batteries A and B are manufactured using negative electrode 11 on which a predetermined amount of lithium is deposited, respectively. Table 1 shows the amount of lithium deposited in each battery. The deposition amount is set such that negative electrode 11 of battery A becomes the full charge state when battery A is fully charged (100% charge depth), and negative electrode 11 of battery B becomes the full discharge state (0% charge depth) when battery B is fully discharged.

TABLE 1

|  | State of negative electrode at full discharge | State of negative electrode at full charge | Amount of Li deposited (μm) |
| --- | --- | --- | --- |
| Battery A | 15% | 100% | 11 |
| Battery B | 0% | 85% | 8 |

The deterioration detecting method in the preferred embodiment is applied to batteries A and B for evaluating the charge/discharge cycle test described in above (4). The deterioration level in each cycle is indicated as a difference between a theoretical discharge capacity and a discharge capacity in each cycle.

In case of battery A, $\Delta V_1$ is a difference between the closed-circuit cutoff battery voltage in charging, which is 4.2 V, and the battery voltage measured after 10 minutes from charging as the open-circuit battery voltage. Apparent resistance $R_1$ is calculated using $\Delta V_1$ and the cutoff current, which is 0.05 C. Results are shown in Table 2. $R_1$ in each cycle is a relative value when $R_1$ in the first cycle is set to 1.

TABLE 2

| Number of cycles | $\Delta V_1$ (V) | $R_1$ | Deterioration level (%) |
| --- | --- | --- | --- |
| 1 | 0.054 | 1.00 | 0 |
| 20 | 0.057 | 1.06 | 3 |
| 40 | 0.060 | 1.11 | 6 |
| 60 | 0.068 | 1.25 | 10 |
| 80 | 0.071 | 1.31 | 14 |
| 100 | 0.075 | 1.39 | 20 |
| 120 | 0.083 | 1.53 | 27 |
| 140 | 0.088 | 1.63 | 33 |
| 160 | 0.097 | 1.79 | 40 |
| 180 | 0.104 | 1.92 | 46 |
| 200 | 0.113 | 2.09 | 53 |
| 220 | 0.120 | 2.22 | 60 |

In case of battery B, $\Delta V_2$ is a difference between the closed-circuit cutoff battery voltage in discharging, which is 2.5V, and the battery voltage measured after 10 minutes from discharging as the open-circuit battery voltage. Apparent resistance $R_2$ is calculated using $\Delta V_2$ and cutoff current, which is 1.0 C. Results are shown in Table 3. $R_2$ in each cycle is a relative value when $R_2$ in the first cycle is set to 1.

TABLE 3

| Number of cycle | $\Delta V_2$ (V) | $R_2$ | Deterioration level (%) |
| --- | --- | --- | --- |
| 1 | 0.803 | 1.00 | 0 |
| 20 | 0.809 | 1.01 | 2 |
| 40 | 0.813 | 1.01 | 5 |
| 60 | 0.823 | 1.02 | 8 |
| 80 | 0.835 | 1.04 | 12 |
| 100 | 0.856 | 1.06 | 17 |
| 120 | 0.887 | 1.10 | 23 |
| 140 | 0.923 | 1.15 | 30 |
| 160 | 0.959 | 1.19 | 37 |
| 180 | 0.990 | 1.23 | 43 |
| 200 | 1.030 | 1.28 | 50 |
| 220 | 1.072 | 1.33 | 57 |

Results shown in Table 2 and Table 3 reveal that discharge capacity significantly deteriorates as the charge/discharge cycle is repeated in both battery A and battery B. If negative electrode 11 is not used in the non-fully charged state, the cycle characteristic obviously and significantly deteriorates. The important point here is that the deterioration level, $\Delta V_1$, and $\Delta V_2$ or the deterioration level, $R_1$, and $R_2$ are extremely well correlated. In other words, the deterioration level can be accurately estimated by using $\Delta V_1$ or $\Delta V_2$, or $R_1$ or $R_2$ in accordance with the deterioration detecting method in the preferred embodiment.

Next, battery C to battery F are manufactured using negative electrode 11 on which a predetermined amount of lithium is deposited, respectively, in accordance with aforementioned (1), (2), and (3). Table 4 shows a non-fully charged level (%) of the negative electrode when the battery is fully discharged, an non-fully charged level (%) of the negative electrode when the battery is fully charged, and amount of lithium deposited in each battery.

Comparison battery A has a negative electrode on which lithium is deposited for the same amount as that of batteries C and D. The deterioration suppressing method in the preferred embodiment is not applied to comparison battery A, and thus the charge time is not changed according to the deterioration level. Comparison battery B has a negative electrode on which lithium is deposited for the same amount as that of batteries E and F. The deterioration suppressing method in the preferred embodiment is not applied to comparison battery B, and thus the charge time is not changed according to the deterioration level.

In batteries C and D and comparison battery A, as shown in Table 4, the negative electrode is set to the full-charge state (100% charge depth) when the battery is fully charged. In batteries E and F and comparison battery B, the negative electrode is set to the full-discharge state (0% charge depth) when the battery is fully discharged.

TABLE 4

|  | State of negative electrode at full discharge | State of negative electrode at full charge | Amount of Li deposited (μm) |
| --- | --- | --- | --- |
| Battery C Battery D Comparison battery A | 15% | 100% | 11 |
| Battery E Battery F Comparison battery B | 0% | 85% | 8 |

The charge/discharge cycle test described in aforementioned (4) is conducted on these batteries, same as battery A, and evaluated. The deterioration level in each cycle is expressed as a difference between the theoretical discharge capacity and a discharge capacity in each cycle.

In case of batteries C and D, $\Delta V_1$ is a difference between closed-circuit cutoff battery voltage in charging, which is 4.5 V, and the battery voltage measured after 10 minutes from charging as the open-circuit battery voltage. $R_1$ is calculated using $\Delta V_1$ and the cutoff current, which is 0.05 C.

For battery C, progression of deterioration is suppressed by resetting the charge time shorter, i.e., 90%, when the deterioration level exceeds 20%, and the charge/discharge cycle is continued. For battery D, progression of deterioration is suppressed by resetting the charge cutoff voltage lower for 0.1 V when the deterioration level exceeds 20%, and the charge/discharge cycle is continued. Table 5 shows results for the 200th cycle. $R_1$ in the $200^{th}$ cycle is relative value when $R_1$ in the first cycle is set to 1.

TABLE 5

|  | $\Delta V_1$ (V) | $R_1$ | Deterioration level (%) |
|---|---|---|---|
| Battery C | 0.073 | 1.34 | 30 |
| Battery D | 0.074 | 1.37 | 32 |
| Comparison battery A | 0.113 | 2.09 | 53 |

In case of batteries E and F, $\Delta V_2$ is a difference between closed circuit cutoff battery voltage in discharging, which is 2.5V, and the battery voltage measured after 10 minutes from discharging as the open-circuit battery voltage. $R_2$ is calculated using $\Delta V_2$ and the cutoff current, which is 1.0 C.

For battery E, progression of deterioration is suppressed by resetting the discharge time shorter, i.e., 90%, when the deterioration level exceeds 20%, and the charge/discharge cycle is continued. For battery F, progression of deterioration is suppressed by resetting the discharge cutoff voltage higher for 0.1V when the deterioration level exceeds 20%, and the charge/discharge cycle is continued. Table 6 shows results for the $200^{th}$ cycle. $R_2$ in the $200^{th}$ cycle is relative value when $R_2$ in the first cycle is set to 1.

TABLE 6

|  | $\Delta V_2$ (V) | $R_2$ | Deterioration level (%) |
|---|---|---|---|
| Battery E | 0.869 | 1.08 | 31 |
| Battery F | 0.863 | 1.07 | 32 |
| Comparison battery B | 1.030 | 1.28 | 50 |

It is apparent from results shown in Table 5 and Table 6 that progression of cycle deterioration is suppressed in batteries C to F to which the deterioration suppressing method in the preferred embodiment is applied. Compared to comparison battery A and comparison battery B, the cycle characteristics are significantly improved.

In other words, the deterioration level can be accurately estimated in rechargeable lithium batteries by using difference $\Delta V_1$ between the closed-circuit charge cutoff voltage and the open-circuit battery voltage after charging, difference $\Delta V_2$ between the closed-circuit discharge cutoff voltage and the open-circuit battery voltage after discharging, apparent resistance $R_1$ that is divided result of $\Delta V_1$ by closed-circuit charge cutoff current ($I_1$), or resistance $R_2$ that is divided result of $\Delta V_2$ by closed-circuit discharge cutoff current ($I_2$), in accordance with the deterioration detecting method for rechargeable lithium batteries in the preferred embodiment. Further deterioration of rechargeable lithium batteries can be significantly suppressed by controlling charging and discharging of rechargeable lithium batteries based on estimation results.

INDUSTRIAL APPLICABILITY

The present invention is applicable to rechargeable lithium batteries that include a positive electrode having a positive active material absorbs and emits lithium ions, a negative electrode having a negative active material that contains at least one element selected from a group of silicon and tin, and lithium-ion conductive electrolyte. The present invention detects the deterioration level in cycle characteristic, and suppresses deterioration so as to enable the use of rechargeable lithium batteries for a long period of time.

The invention claimed is:

1. A deterioration detecting method for a rechargeable lithium battery, the rechargeable lithium battery comprising:
    a positive electrode having a positive active material that absorbs and emits a lithium ion;
    a negative electrode having a negative active material that contains at least one of elements of silicon and tin; and
    an electrolyte having lithium-ion conductivity, the electrolyte being provided between the positive electrode and the negative electrode;
    the deterioration detecting method comprising:
    detecting
    a group of a closed-circuit charge cutoff voltage and an open-circuit voltage after charging of the rechargeable lithium battery;
    calculating an evaluation value based on the detected group of voltages;
    comparing the evaluation value and a reference value stored in advance to have a comparison result; and
    estimating a deterioration level of the rechargeable lithium battery based on the comparison result,
    wherein the evaluation value is an apparent resistance $R_1$ at completion of charging, the apparent resistance $R_1$ calculated based on a relational expression of:

$$R_1 = \Delta V_1 / I_1,$$

where $\Delta V_1$ is a difference between the closed-circuit charge cutoff voltage and the open-circuit voltage after charging, and
    $I_1$ is a closed circuit charge cutoff current.

2. A deterioration suppressing method for a rechargeable lithium battery, the rechargeable lithium battery comprising:
    a positive electrode having a positive active material that absorbs and emits a lithium ion;
    a negative electrode having a negative active material that contains at least one of elements of silicon and tin; and
    an electrolyte having lithium-ion conductivity, the electrolyte being provided between the positive electrode and the negative electrode;
    the deterioration suppressing method comprising:
    detecting
    a group of a closed-circuit charge cutoff voltage and an open-circuit voltage after charging of the rechargeable lithium battery;
    calculating an evaluation value based on the detected group of the voltages;
    comparing the evaluation value and a reference value stored in advance to have a comparison result;

estimating a deterioration level of the rechargeable lithium battery based on the comparison result; and controlling charging of the rechargeable lithium battery based on the estimated deterioration level, wherein the evaluation value is an apparent resistance $R_1$ at completion of charging, the apparent resistance $R_1$ calculated based on a relational expression of:

$$R_1 = \Delta V_1 / I_1,$$

where $\Delta V_1$ is a difference between the closed-circuit charge cutoff voltage and the open-circuit voltage after charging, and $I_1$ is a closed circuit charge cutoff current.

3. The deterioration suppressing method for a rechargeable lithium battery according to claim 2, wherein a charge time is shortened to control charging.

4. The deterioration suppressing method for a rechargeable lithium battery according to claim 2, wherein the closed-circuit charge cutoff voltage is reduced to control charging.

5. A deterioration suppressing method for a rechargeable lithium battery, the rechargeable lithium battery comprising:

a positive electrode having a positive active material that absorbs and emits a lithium ion;

a negative electrode having a negative active material that contains at least one of elements of silicon and tin; and an electrolyte having lithium-ion conductivity, the electrolyte being provided between the positive electrode and the negative electrode;

the deterioration suppressing method comprising:

detecting a group of a closed-circuit charge cutoff voltage and an open-circuit voltage after charging of the rechargeable lithium battery;

calculating an evaluation value based on the detected group of the voltages;

comparing the evaluation value and a reference value stored in advance to have a comparison result;

estimating a deterioration level of the rechargeable lithium battery based on the comparison result; and controlling discharging of the rechargeable lithium battery based on the estimated deterioration level, wherein the evaluation value is an apparent resistance $R_1$ at completion of charging, the apparent resistance $R_1$ calculated based on a relational expression of:

$$R_1 = \Delta V_1 / I_1,$$

where $\Delta V_1$ is a difference between the closed-circuit charge cutoff voltage and the open-circuit voltage after charging, and $I_1$ is a closed circuit charge cutoff current.

6. The deterioration suppressing method for a rechargeable lithium battery according to claim 5, wherein a discharge time is shortened to control discharging.

7. A deterioration detector for a rechargeable lithium battery, the rechargeable lithium battery comprising:

a positive electrode having a positive active material that absorbs and emits a lithium ion;

a negative electrode having a negative active material that contains at least one of elements of silicon and tin; and an electrolyte having lithium-ion conductivity, the electrolyte being provided between the positive electrode and the negative electrode;

the deterioration detector comprising:

a detector configured to detect a group of a closed-circuit charge cutoff voltage and an open-circuit voltage after charging of the rechargeable lithium battery;

a calculator configured to calculate an evaluation value based on the detected group of voltages;

a comparator configured to compare the evaluation value with a reference value stored in advance to have a comparison result; and a determiner configured to estimate a deterioration level of the rechargeable battery based on the comparison result in the comparator, wherein the evaluation value is an apparent resistance $R_1$ at completion of charging, the apparent resistance $R_1$ calculated based on a relational expression of:

$$R_1 = \Delta V_1 / I_1,$$

where $\Delta V_1$ is a difference between the closed-circuit charge cutoff voltage and the open-circuit voltage after charging, and $I_1$ is a closed circuit charge cutoff current.

8. A deterioration suppressor for a rechargeable lithium battery, the rechargeable lithium battery comprising:

a positive electrode having a positive active material that absorbs and emits a lithium ion;

a negative electrode having a negative active material that contains at least one of elements of silicon and tin; and an electrolyte having lithium-ion conductivity, the electrolyte being provided between the positive electrode and the negative electrode;

the deterioration suppressor comprising:

a detector configured to detect a group of a closed-circuit charge cutoff voltage and an open-circuit voltage after charging of the rechargeable lithium battery;

a calculator configured to calculate an evaluation value based on the detected group of voltages;

a comparator configured to compare the evaluation value with a reference value already stored to have a comparison result;

a determiner configured to estimate a deterioration level of the rechargeable battery based on the comparison result in the comparator; and a controller configured to control charging of the rechargeable lithium battery based on the deterioration level estimated by the determiner, wherein the evaluation value is an apparent resistance $R_1$ at completion of charging, the apparent resistance $R_1$ calculated based on a relational expression of:

$$R_1 = \Delta V_1 / I_1,$$

where $\Delta V_1$ is a difference between the closed-circuit charge cutoff voltage and the open-circuit voltage after charging, and $I_1$ is a closed circuit charge cutoff current.

9. A battery pack comprising the deterioration suppressor according to claim 8 and a rechargeable lithium battery.

10. A charger comprising the deterioration suppressor according to claim 8 and a charging part configured to charge a rechargeable lithium battery.

11. A deterioration suppressor for a rechargeable lithium battery, the rechargeable lithium battery comprising:

a positive electrode having a positive active material that absorbs and emits a lithium ion;

a negative electrode having a negative active material that contains at least one of elements of silicon and tin; and an electrolyte having lithium-ion conductivity, the electrolyte being provided between the positive electrode and the negative electrode;

the deterioration suppressor comprising:

a detector configured to detect a group of a closed-circuit charge cutoff voltage and an open-circuit voltage after charging of the rechargeable lithium battery;

a calculator configured to calculate an evaluation value based on the detected group of voltages;

a comparator configured to compare the evaluation value with a reference value stored in advance to have a comparison result;

a determiner configured to estimate a deterioration level of the rechargeable battery based on the comparison result in the comparator; and a controller configured to control discharging of the rechargeable lithium battery based on the deterioration level estimated by the detector, wherein the evaluation value is an apparent resistance $R_1$ at completion of charging, the apparent resistance $R_1$ calculated based on a relational expression of:

$$R_1 = \Delta V_1 / I_1,$$

where $\Delta V_1$ is a difference between the closed-circuit charge cutoff voltage and the open-circuit voltage after charging, and $I_1$ is a closed circuit charge cutoff current.

12. A battery pack comprising the deterioration suppressor according to claim 11 and a rechargeable lithium battery.

13. A deterioration detecting method for a rechargeable lithium battery, the rechargeable lithium battery comprising:

a positive electrode having a positive active material that absorbs and emits a lithium ion;

a negative electrode having a negative active material that contains at least one of elements of silicon and tin; and an electrolyte having lithium-ion conductivity, the electrolyte being provided between the positive electrode and the negative electrode;

the deterioration detecting method comprising:

detecting a group of a closed-circuit discharge cutoff voltage and an open-circuit voltage after discharging of the rechargeable lithium battery;

calculating an evaluation value based on the detected group of voltages;

comparing the evaluation value and a reference value stored in advance to have a comparison result; and estimating a deterioration level of the rechargeable lithium battery based on the comparison result, wherein the evaluation value is an apparent resistance $R_2$ at completion of discharging, the apparent resistance $R_2$ calculated based on a relational expression of:

$$R_2 = \Delta V_2 / I_2,$$

where $\Delta V_2$ is a difference between the closed-circuit discharge cutoff voltage and the open-circuit voltage after discharging, and $I_2$ is a closed-circuit discharge cutoff current.

14. A deterioration suppressing method for a rechargeable lithium battery, the rechargeable lithium battery comprising:

a positive electrode having a positive active material that absorbs and emits a lithium ion;

a negative electrode having a negative active material that contains at least one of elements of silicon and tin; and an electrolyte having lithium-ion conductivity, the electrolyte being provided between the positive electrode and the negative electrode;

the deterioration suppressing method comprising:

detecting a group of a closed-circuit discharge cutoff voltage and an open-circuit voltage after discharging of the rechargeable lithium battery;

calculating an evaluation value based on the detected group of the voltages;

comparing the evaluation value and a reference value stored in advance to have a comparison result;

estimating a deterioration level of the rechargeable lithium battery based on the comparison result; and controlling charging of the rechargeable lithium battery based on the estimated deterioration level, wherein the evaluation value is an apparent resistance $R_2$ at completion of discharging, the apparent resistance $R_2$ calculated based on a relational expression of:

$$R_2 = \Delta V_2 / I_2,$$

where $\Delta V_2$ is a difference between the closed-circuit discharge cutoff voltage and the open-circuit voltage after discharging, and $I_2$ is a closed-circuit discharge cutoff current.

15. The deterioration suppressing method for a rechargeable lithium battery according to claim 14, wherein a charge time is shortened to control charging.

16. A deterioration suppressing method for a rechargeable lithium battery, the rechargeable lithium battery comprising:

a positive electrode having a positive active material that absorbs and emits a lithium ion;

a negative electrode having a negative active material that contains at least one of elements of silicon and tin; and an electrolyte having lithium-ion conductivity, the electrolyte being provided between the positive electrode and the negative electrode;

the deterioration suppressing method comprising:

detecting a group of a closed-circuit discharge cutoff voltage and an open-circuit voltage after discharging of the rechargeable lithium battery;

calculating an evaluation value based on the detected group of the voltages;

comparing the evaluation value and a reference value stored in advance to have a comparison result;

estimating a deterioration level of the rechargeable lithium battery based on the comparison result; and controlling discharging of the rechargeable lithium battery based on the estimated deterioration level, wherein the evaluation value is an apparent resistance $R_2$ at completion of discharging, the apparent resistance $R_2$ calculated based on a relational expression of:

$$R_2 = \Delta V_2 / I_2,$$

where $\Delta V_2$ is a difference between the closed-circuit discharge cutoff voltage and the open-circuit voltage after discharging, and $I_2$ is a closed-circuit discharge cutoff current.

17. The deterioration suppressing method for a rechargeable lithium battery according to claim 16, wherein a discharge time is shortened to control discharging.

18. The deterioration suppressing method for a rechargeable lithium battery according to claim 16, wherein the closed-circuit discharge cutoff voltage is increased to control discharging.

19. A deterioration detector for a rechargeable lithium battery, the rechargeable lithium battery comprising:

a positive electrode having a positive active material that absorbs and emits a lithium ion;

a negative electrode having a negative active material that contains at least one of elements of silicon and tin; and an electrolyte having lithium-ion conductivity, the electrolyte being provided between the positive electrode and the negative electrode;

the deterioration detector comprising:

a detector configured to detect a group of a closed-circuit discharge cutoff voltage and an open-circuit voltage after discharging of the rechargeable lithium battery;

a calculator configured to calculate an evaluation value based on the detected group of voltages;

a comparator configured to compare the evaluation value with a reference value stored in advance to have a comparison result; and a determiner configured to estimate a deterioration level of the rechargeable battery based on the comparison result in the comparator, wherein the evaluation value is an apparent resistance $R_2$ at completion of discharging, the apparent resistance $R_2$ calculated based on a relational expression of:

$$R_2 = \Delta V_2 / I_2,$$

where $\Delta V_2$ is a difference between the closed-circuit discharge cutoff voltage and the open-circuit voltage after discharging, and $I_2$ is a closed-circuit discharge cutoff current.

20. A deterioration suppressor for a rechargeable lithium battery, the rechargeable lithium battery comprising:

a positive electrode having a positive active material that absorbs and emits a lithium ion;

a negative electrode having a negative active material that contains at least one of elements of silicon and tin; and an electrolyte having lithium-ion conductivity, the electrolyte being provided between the positive electrode and the negative electrode;

the deterioration suppressor comprising:

a detector configured to detect a group of a closed-circuit discharge cutoff voltage and an open-circuit voltage after discharging of the rechargeable lithium battery;

a calculator configured to calculate an evaluation value based on the detected group of voltages;

a comparator configured to compare the evaluation value with a reference value already stored to have a comparison result;

a determiner configured to estimate a deterioration level of the rechargeable battery based on the comparison result in the comparator; and a controller configured to control charging of the rechargeable lithium battery based on the deterioration level estimated by the determiner, wherein the evaluation value is an apparent resistance $R_2$ at completion of discharging, the apparent resistance $R_2$ calculated based on a relational expression of:

$$R_2 = \Delta V_2 / I_2,$$

where $\Delta V_2$ is a difference between the closed-circuit discharge cutoff voltage and the open-circuit voltage after discharging, and $I_2$ is a closed-circuit discharge cutoff current.

21. A battery pack comprising the deterioration suppressor according to claim 20 and a rechargeable lithium battery.

22. A charger comprising the deterioration suppressor according to claim 20 and a charging part configured to charge a rechargeable lithium battery.

23. A deterioration suppressor for a rechargeable lithium battery, the rechargeable lithium battery comprising:

a positive electrode having a positive active material that absorbs and emits a lithium ion;

a negative electrode having a negative active material that contains at least one of elements of silicon and tin; and an electrolyte having lithium-ion conductivity, the electrolyte being provided between the positive electrode and the negative electrode;

the deterioration suppressor comprising:

a detector configured to detect a group of a closed-circuit discharge cutoff voltage and an open-circuit voltage after discharging of the rechargeable lithium battery;

a calculator configured to calculate an evaluation value based on the detected group of voltages;

a comparator configured to compare the evaluation value with a reference value stored in advance to have a comparison result;

a determiner configured to estimate a deterioration level of the rechargeable battery based on the comparison result in the comparator; and a controller configured to control discharging of the rechargeable lithium battery based on the deterioration level estimated by the detector, wherein the evaluation value is an apparent resistance $R_2$ at completion of discharging, the apparent resistance $R_2$ calculated based on a relational expression of:

$$R_2 = \Delta V_2 / I_2,$$

where $\Delta V_2$ is a difference between the closed-circuit discharge cutoff voltage and the open-circuit voltage after discharging, and $I_2$ is a closed-circuit discharge cutoff current.

24. A battery pack comprising the deterioration suppressor according to claim 23 and a rechargeable lithium battery.

* * * * *